US008849602B2

(12) United States Patent
Nishimura et al.

(10) Patent No.: US 8,849,602 B2
(45) Date of Patent: Sep. 30, 2014

(54) CALIBRATING RECONSTRUCTED SIGNAL USING MULTI-TONE CALIBRATION SIGNAL

(75) Inventors: Ken A. Nishimura, Fremont, CA (US); Kenneth Rush, Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 519 days.

(21) Appl. No.: 13/283,084

(22) Filed: Oct. 27, 2011

(65) Prior Publication Data

US 2013/0110442 A1   May 2, 2013

(51) Int. Cl.
G01R 13/02    (2006.01)

(52) U.S. Cl.
CPC .................................. *G01R 13/0272* (2013.01)
USPC ....................................................... 702/106

(58) Field of Classification Search
CPC ................................................... G01R 13/0272
USPC ....................................................... 702/106
See application file for complete search history.

(56) References Cited

U.S. PATENT DOCUMENTS

| 4,031,883 | A | 6/1977 | Fehmi et al. |
| 5,568,142 | A | 10/1996 | Velazquez et al. |
| 7,058,548 | B2 | 6/2006 | Pupalaikis et al. |
| 7,139,684 | B2 | 11/2006 | Pupalaikis et al. |
| 7,219,037 | B2 | 5/2007 | Pupalaikis et al. |
| 7,222,055 | B2 | 5/2007 | Pupalaikis et al. |
| RE39,693 | E | 6/2007 | Pupalaikis |
| 7,373,281 | B2 | 5/2008 | Pupalaikis et al. |
| 7,386,409 | B2 | 6/2008 | Mueller et al. |
| 7,519,513 | B2 | 4/2009 | Pupalaikis et al. |
| 7,653,514 | B2 | 1/2010 | Pupalaikis et al. |
| 7,711,510 | B2 | 5/2010 | Pupalaikis et al. |
| 7,957,938 | B2 | 6/2011 | LaMarche et al. |
| 2004/0128076 | A1 | 7/2004 | Pupalaikis et al. |
| 2007/0185669 | A1* | 8/2007 | Pupalaikis et al. .............. 702/75 |
| 2010/0244811 | A1 | 9/2010 | Pupalaikis et al. |

FOREIGN PATENT DOCUMENTS

DE   102008043856 A1   6/2009

OTHER PUBLICATIONS

Search Report dated May 29, 2013 in German Patent Application No. 102012217582.2.

* cited by examiner

*Primary Examiner* — Bryan Bui

(57) ABSTRACT

A method of calibrating a reconstructed signal from a plurality of sub-signals is provided. The method includes injecting a calibration signal having multiple tones into a received input signal; dividing the input signal into a first and second sub-signal, including an overlapping frequency band; performing a first frequency translation by converting frequency components of the second sub-signal; digitizing the first sub-signal and the frequency converted second sub-signal; performing a second frequency translation to reverse the first frequency translation to obtain a reconstructed second sub-signal; and quantifying impairments to the digital first sub-signal and reconstructed second sub-signal caused by differences in magnitude and phase of frequency components within the overlapping frequency band.

23 Claims, 3 Drawing Sheets

CALIBRATING RECONSTRUCTED SIGNAL USING MULTI-TONE CALIBRATION SIGNAL

BACKGROUND

The analog bandwidth of a real-time oscilloscope is the highest frequency of an applied input signal that the oscilloscope is able to faithfully capture. Conventional real-time oscilloscopes typically use a digitizing architecture, in which the applied input signal is converted from the analog domain into digital data by an analog-to-digital converter (ADC). The digital data is then processed to display a waveform corresponding to the input signal on a display, and to extract desired information about the input signal.

Due to technological limitations of the ADC and related analog circuitry, the bandwidth of a real-time oscilloscope channel is limited. For example, a conventional oscilloscope may include four channels, each of which has a limited bandwidth of 0 (DC) to about 32 GHz. Therefore, an input signal having a bandwidth greater than 32 GHz cannot be faithfully captured by a single oscilloscope channel. One approach to overcome this limitation is to divide the input signal into multiple sub-signals each having a bandwidth less than the bandwidth of the available oscilloscope channel, followed by reconstruction after each of the sub-signals is digitized and passed through a corresponding oscilloscope channel, which may be referred to as frequency domain interleaving. However, interleaving processes may cause various, undesirable signal impairments.

As technology for modern electronics advances, there exists an increasing need to accurately and efficiently digitize input signals having frequency components covering more than the available bandwidth of an oscilloscope channel.

SUMMARY

In a representative embodiment, a method is provided for calibrating a reconstructed signal from a plurality of sub-signals. The method includes injecting a calibration signal into a received input signal, the calibration signal including multiple tones; dividing the input signal with the injected calibration signal into at least a first sub-signal having a first frequency band and a second sub-signal having a second frequency band, where a portion of the first frequency band overlaps a portion of the second frequency band to form an overlapping frequency band; performing a first frequency translation by converting frequency components of the second sub-signal within the second frequency band to obtain a frequency converted second sub-signal; digitizing the first sub-signal and the frequency converted second sub-signal; quantifying impairments to the first sub-signal and the second sub-signal caused by differences in magnitude and phase of frequency components of the first and second sub-signals within the overlapping frequency band; and performing a second frequency translation to reverse the first frequency translation by converting the frequency components of the digital frequency converted second sub-signal to the frequency components within the second frequency band to obtain a reconstructed second sub-signal. Quantifying the impairments includes measuring relative magnitudes and phases of the tones of the calibration signal present in the digital first sub-signal and one of the frequency converted second sub-signal and the reconstructed second sub-signal.

In another representative embodiment, a method is provided for calibrating a reconstructed signal from a plurality of sub-signals. The method includes injecting a calibration signal into a received input signal, the calibration signal including multiple tones; dividing the input signal with the injected calibration signal into a plurality of sub-signals having a corresponding plurality of frequency bands, including a first sub-signal having a lowest frequency band, where portions of adjacent frequency bands overlap to form a corresponding overlapping frequency band; performing first frequency translations by converting frequency components of each sub-signal other than the first sub-signal band to obtain a frequency converted sub-signal; digitizing the first sub-signal and each of the frequency converted sub-signals; quantifying impairments to the plurality of sub-signals caused by differences in magnitude and phase of the corresponding frequency components within each overlapping frequency band; and performing second frequency translations to reverse the first frequency translations to obtain reconstructed sub-signals corresponding to the frequency converted sub-signals. Quantifying the impairments includes measuring relative magnitudes and phases of the multiple tones of the calibration signal present in the multiple sub-signals.

In another representative embodiment, a system for calibrating a reconstructed signal from a plurality of sub-signals includes a coupler, a splitter, a mixer, first and second analog-to-digital converters (ADCs), a digital frequency converter and a processor. The coupler is configured to inject a calibration signal into an input signal, the calibration signal including multiple tones in a predetermined frequency range. The splitter is configured to split the input signal with the injected calibration signal into a first sub-signal having a first frequency band and a second sub-signal having a second frequency band, where a portion of the first frequency band overlaps a portion of the second frequency band to form a transition frequency band, which corresponds to the predetermined frequency range. The mixer is configured to multiply the second sub-signal and a local oscillator mixing signal having a local oscillator frequency to convert frequency components of the second sub-signal within the second frequency band to a lower frequency band. The first ADC is configured to digitize the first sub-signal and the second ADC is configured to digitize the frequency converted second sub-signal. The digital frequency converter is configured to multiply the digital frequency converted second sub-signal and a synthesized local oscillator replicating the local oscillator frequency used to obtain the frequency converted second sub-signal to convert the frequency components of the digital frequency converted second sub-signal to obtain a reconstructed second sub-signal. The processor is configured to quantify impairments to the digital first sub-signal and the reconstructed second sub-signal caused by differences in magnitude and phase of frequency components of the first and second sub-signals within the transition frequency band, where quantifying the impairments includes measuring relative magnitudes and phases of the plurality of tones of the calibration signal present in the digital first sub-signal and the reconstructed second sub-signal.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
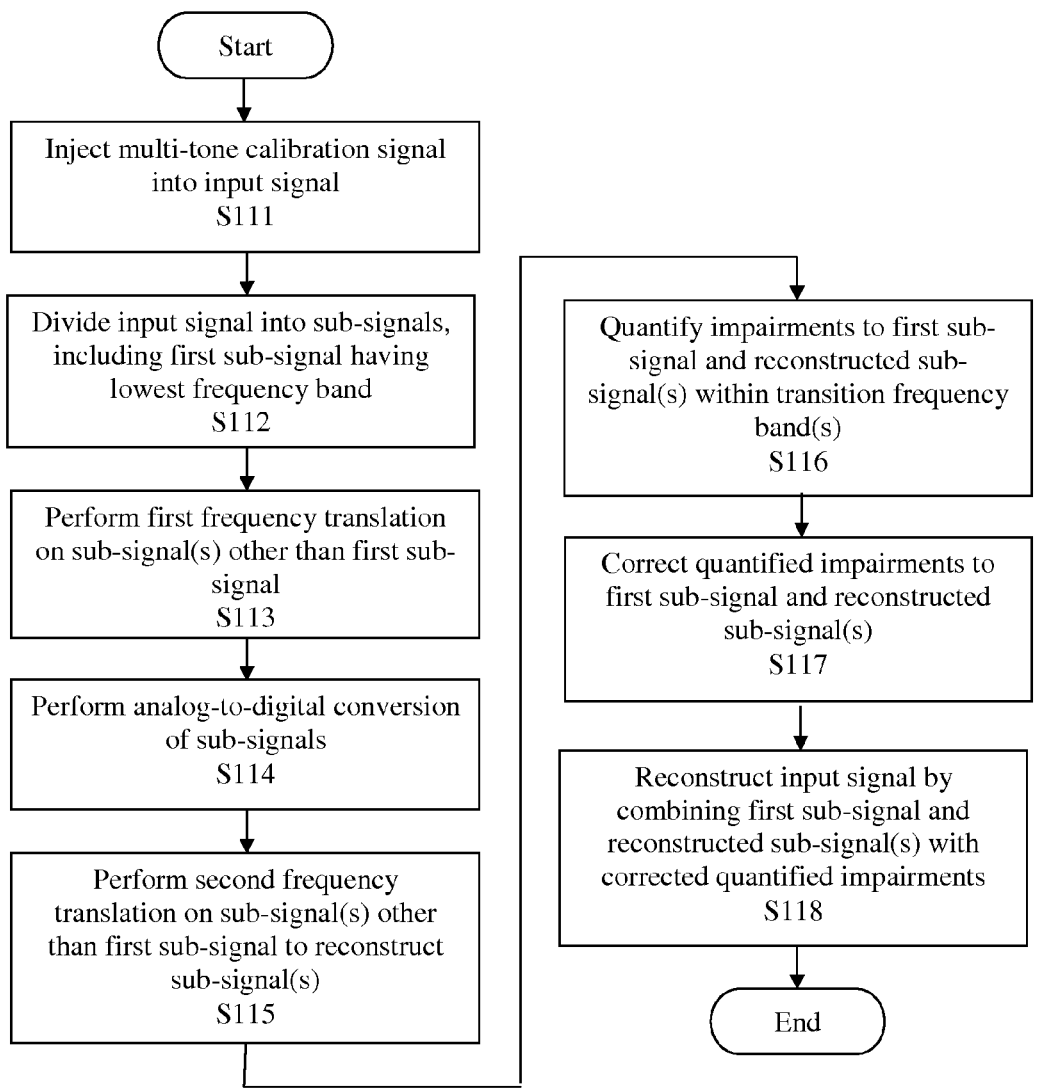
FIG. 1 is a flow diagram depicting a method of calibrating a reconstructed signal from multiple sub-signals, according to a representative embodiment.

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

Various representative embodiments generally provide methods and systems for monitoring and correcting impairments in a frequency division multiplexed communications channel. The various representative embodiments process an input signal of bandwidth N*B, dividing the input signal into N sub-signals, where N is a positive integer. Each sub-signal has a bandwidth of approximately B Hertz (Hz), where B is less than or equal to a maximum channel bandwidth, e.g., of an oscilloscope channel. For example, the maximum channel bandwidth may be in the GHz range (e.g., 32 GHz), such that B would be about 32 GHz. The embodiments may be applied to real-time oscilloscopes, for example, in which multiple channels, each having a bandwidth of approximately B, may be combined to form a single virtual channel having N times the bandwidth B. That is, multiple real-time oscilloscope channels may be combined to synthesize a single virtual channel with a bandwidth exceeding that of a constituent oscilloscope channel. According to the various embodiments, phase and magnitude of the synthesized channel are corrected using multiple tones of a calibration signal injected into the input signal prior to dividing the input signal into the N sub-signals.

FIG. 1 is a flow diagram depicting a method of calibrating a reconstructed signal from multiple sub-signals, according to a representative embodiment.

Referring to FIG. 1, a multi-tone calibration signal is injected into an input signal in block S111. The multi-tone calibration signal may be a repetitive bit sequence, such as a pseudo-random bit sequence (PRBS), for example. A spectrum of the repetitive bit sequence extends from DC to a nominal value, and the calibration signal may be represented by a zero-order hold (NRZ) waveform, for example. The calibration signal must have frequency components within each transition frequency band, which is the frequency band containing overlapping frequency between adjacent sub-signals, as discussed below. In an illustrative embodiment, a PRBS is used to generate the calibration signal with frequency components extending from DC to a first frequency f1. The PRBS is frequency translated, e.g., by a mixer, such that the frequency components that lie between DC and the first frequency f1 are translated to B+/−(f1), as discussed below with reference to FIG. 2. Accordingly, the calibration signal may be a PRBS modulating a carrier at the first frequency f1, for example, and may include frequency components within the transition frequency band.

In block S112, the input signal with the injected calibration signal is divided into multiple sub-signals, including a first sub-signal having the lowest frequency band. For example, as mentioned above, assuming the input signal has a bandwidth N*B, where B is the bandwidth of each of multiple channels intended to receive the input signal, the input signal may be divided into N sub-signals in block S112. The first sub-signal having the lowest frequency band would therefore have a corresponding bandwidth from DC (0) to about B, the second sub-signal would have a corresponding bandwidth from about B to about 2*B, . . . and the Nth sub-signal would have a corresponding bandwidth from about (N−1)*B to about N*B. As noted above, if more than two bands are used, the calibration signal must have frequency components (spectral content) within each respective transition frequency band between adjacent bands. Thus, in the above example, the first sub-signal may be intended for a first oscilloscope channel, the second sub-signal may be intended for a second first oscilloscope channel, and Nth sub-signal may be intended for a an Nth oscilloscope channel.

A first frequency translation is then performed on the one or more sub-signals (hereinafter referred to as "sub-signal(s)") other than first sub-signal in block S113, so that each of the sub-signal(s) has approximately the same bandwidth (DC to about B), or at least a bandwidth less than or equal to B. By performing the first frequency translation, each of the sub-signals is able to pass through the corresponding limited bandwidth channel (i.e., less than or equal to B), through which the input signal otherwise could not pass.

For example, an oscilloscope may have multiple channels of about 32 GHz each, and the input signal may have an original bandwidth of about 64 GHz, in which case B=32 GHz and N=2. Accordingly, in block S112, the input signal is divided into two sub-signals, including the first sub-signal having a bandwidth from DC to about 32 GHz and a second sub-signal having a bandwidth from about 32 GHz to about 64 GHz (with some overlap between the respective bandwidths in the transition frequency band, discussed below). In block S113, the second sub-signal is translated to a frequency band of DC to about 32 GHz according to the first frequency translation, in which case the second sub-signal may likewise pass through one of the 32 GHz channels of the oscilloscope. In an embodiment, the first frequency translation involves frequency inversion of the second sub-signal, such that a frequency component at about 32 GHz remains at about the same frequency in the frequency translated second sub-signal, while a frequency component at about 64 GHz is frequency translated to DC. The frequency components between 32 GHz and 64 GHz are similarly frequency translated to provide a frequency translated second sub-signal having frequency components in reverse order. Such frequency inversion may be accomplished as a by-product of high-side mixing, for example, although other techniques, such as low-side mixing, which may or may not involve frequency inversion may be incorporated without departing from the scope of the present teachings. It is understood that operation of the calibration signal is independent of mixing type and/or the use of frequency inversion.

In block S114 of FIG. 1, analog-to-digital conversion is performed on all of the sub-signals, including the first sub-signal and the frequency translated sub-signal(s), to provide N digital sub-signals. A second frequency translation is then performed on the frequency translated digital sub-signal(s) in block S115 in to reconstruct (in the digital domain) the sub-signal(s) to the initial band(s). For example, in the above illustration, the digital second sub-signal is translated to the original frequency band of about 32 GHz to about 64 GHz according to the second frequency translation, thus reconstructing the second sub-signal. The digital first sub-signal still has its original frequency band of DC to about 32 GHz.

Notably, the first sub-signal and the reconstructed sub-signal(s) include one or more transition frequency bands where the frequency bands overlap. For example, when the input signal is divided into two sub-signals (first and second sub-signals), the corresponding frequency bands overlap by a predetermined transition frequency band. For example, the first sub-signal may have a bandwidth from DC to 32.5 GHz and the second sub-signal may have a bandwidth from 31.5 GHz to about 64 GHz. Accordingly, the transition frequency band has a bandwidth of about 1 GHz, corresponding to the overlap between the first and second sub-signals and extending from about 31.5 GHz to about 32.5 GHz. Similarly, when the input signal is divided into three sub-signals (first, second and third sub-signals), the corresponding frequency bands overlap by a predetermined transition frequency band between the first and second sub-signals and between the second and third sub-signals, providing first and second transition frequency bands, respectively. For example, for an 96 GHz input signal, the first sub-signal may have a bandwidth from DC to 32.5 GHz, the second sub-signal may have a bandwidth from 31.5 GHz to 64.5 GHz, and the third sub-signal may have a bandwidth from 63.5 GHz to about 96 GHz. Thus, the first transition frequency band may have a bandwidth extending from about 31.5 GHz to about 32.5 GHz, and the second transition frequency band may have a bandwidth extending from about 63.5 GHz to about 64.5 GHz. The transition frequency bands include impairments that must be removed to obtain a clean, fully reconstructed (digital) input signal.

Notably, because there are multiple sub-signals, there may be mismatches in the impairments within the transition frequency band. That is, each oscilloscope channel has impairments. In a simple single channel system (i.e., no interleave), it is relatively straight forward to measure and calibrate out the impairments. However, in a frequency interleaved channel, if the impairments are different in the transition frequency band(s), different solutions for the same input signal for frequency components within the transition frequency band(s) may result. According to various embodiments, the impairment components from each channel are identified and corrected, such that the reconstructed signal is made whole.

Therefore, in block S116, impairments to the first sub-signal and to the reconstructed sub-signal(s) are quantified within the one or more transition frequency bands, which may include measuring the relative magnitudes and phases of the tones of the calibration signal. Notably, in various embodiments, gain and phase correction may be performed before the second frequency translation in block S115 to save computation time. Generally, the impairments are quantified using the tones from the multi-tone calibration signal injected into an input signal in block S111.

Figure 3:
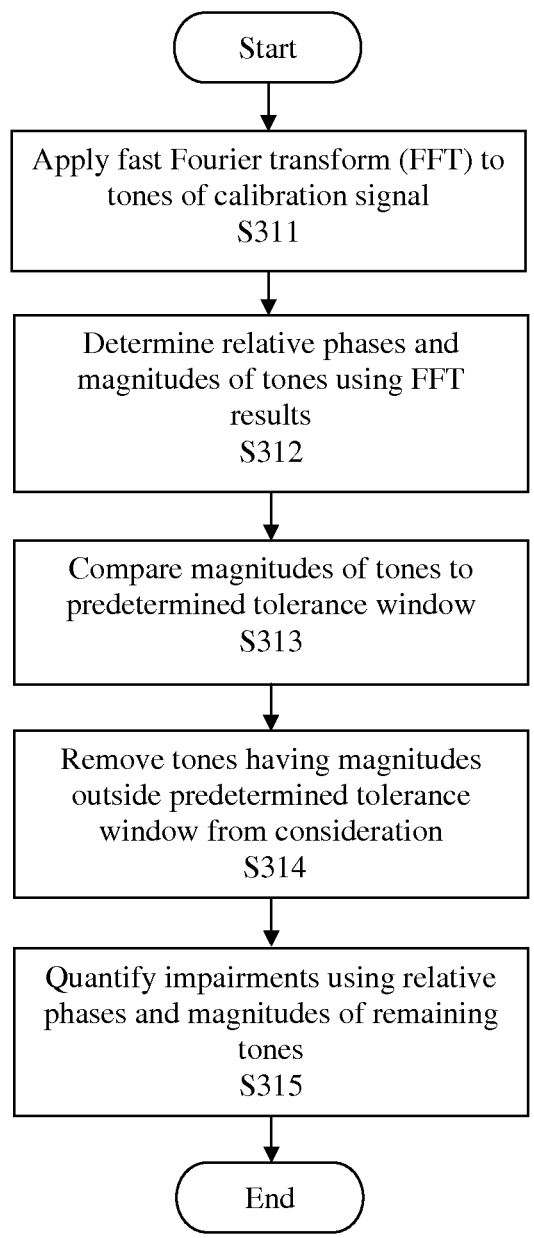
FIG. 3 is a flow diagram depicting a method of quantifying impairments in sub-signals using tones from a calibration signal, according to a representative embodiment.

FIG. 3 is a flow diagram showing a method of quantifying impairments to the first sub-signal and the reconstructed sub-signal(s) caused by differences in phase and magnitude of frequency components of the tones within the transition frequency band(s), according to a representative embodiment.

Referring to FIG. 3, in block S311, a fast Fourier transform (FFT) is applied to the multiple tones of the multi-tone calibration signal within the transition frequency band(s). The relative phases and magnitudes of the multiple tones may then be determined in block S312 using the FFT results, thus indicating differences in phase and magnitude between each of the tones present in the first sub-signal and the corresponding original tone of the multi-tone calibration signal, as well as differences in phase and magnitude between each of the tones present in the reconstructed second sub-signal(s) and the corresponding original tone of the multi-tone calibration signal.

In blocks S313 and S314, use of the multiple tones is gated by analyzing each of the tones of the multi-tone calibration signal transition frequency band(s). In the event that the actual input signal has a frequency component identical to one of the tones in the calibration signal, that tone may be discarded from the calibration algorithm if the input signal frequency component destructively interferes with the calibration signal tone. For example, in block 313, amplitude (magnitude) of each tone is compared to a predetermined tolerance window. Any tone having amplitude that is too small is removed from consideration in block S314, resulting in a set of remaining tones of the multi-tone calibration signal. The impairments may then be quantified using the relative phases and magnitudes of the set of remaining tones in block 5315. The impairments may be directed to phase of a local oscillator (LO) signal used in the first frequency translation (in block S213), discussed below, where other impairments, such as gain and phase of the recording channels, have already been removed.

Referring again to FIG. 1, once the impairments have been quantified, the first sub-signal and each of the reconstructed sub-signals are corrected (e.g. with respect to phase of the LO signal) using any impairment correction technique in block S117. For example, correcting the quantified impairments may include constructing a filter having a frequency response that inverts distortion imposed by dividing (and reconstructing) the input signal. This corrects at least the magnitudes of the tones of the multi-tone calibration signal. Correcting the quantified impairments may further include matching the phases between the tones in the first sub-signal and the reconstructed sub-signals to globally correct the phases of the plurality of tones. The input signal is then reconstructed in block S118 by combining the corrected digital first sub-signal and the corrected reconstructed sub-signal(s), resulting in a reconstructed input signal having the original bandwidth. In an embodiment, since the injected calibration signal is known, it may be removed digitally to increase the fidelity of the captured signal. However, this step is optional, since the tones of the calibration signal are of relatively low amplitude and removal of the tones is not required to properly calibrate the system.

Figure 2:
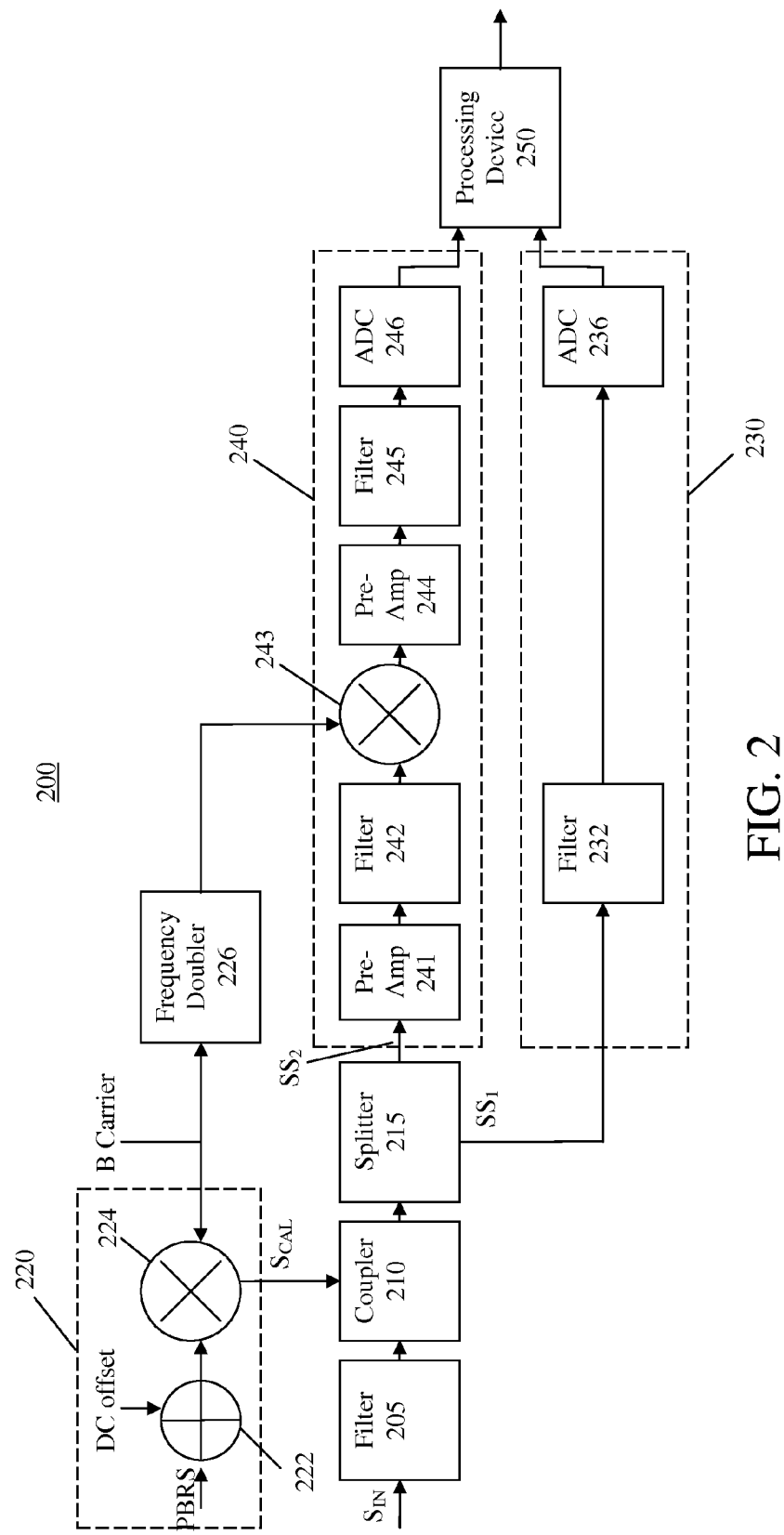
FIG. 2 is a simplified block diagram depicting a system for calibrating a reconstructed signal from multiple sub-signals, according to a representative embodiment.

FIG. 2 is a simplified block diagram depicting a system for calibrating a reconstructed signal from multiple sub-signals, according to a representative embodiment. The calibration system processes an input signal having a bandwidth of N*B, and divides the input signal into N sub-signals, each of which has a corresponding bandwidth of approximately B, and ultimately reconstructs the original input signal following digitization. For ease of explanation, it is assumed that input signal $S_{IN}$ has a bandwidth of about 2*B (e.g., approximately 64 GHz) and is to be divided into two sub-signals, first sub-signal $SS_1$ and second sub-signal $SS_2$, each having a bandwidth of B (e.g., approximately 32 GHz), such that N=2 and B=32 GHz. Of course, the system may be configured to accommodate various bandwidths and numbers of sub-signals without departing from the scope of the present teachings.

Referring to FIG. 2, illustrative calibration system 200 includes input signal filter 205, coupler 210, splitter 215, first sub-signal path 230, second sub-signal path 240, and processing device 250. The input signal $S_{IN}$ may be input to the input signal filter 205 via a step attenuator (not shown). The input signal filter 205 may be an anti-aliasing (AA) filter, for example, with a passband that corresponds to the predetermined bandwidth of the input signal $S_{IN}$, which is DC to about 2*B (e.g., DC to about 64 GHz).

The coupler 210 receives the filtered input signal $S_{IN}$ from the input signal filter 205 and multi-tone calibration signal $S_{CAL}$ from multi-tone calibration signal generation circuit 220, such that the multi-tone calibration signal $S_{CAL}$ is continuously injected into the filtered input signal $S_{IN}$. In the depicted embodiment, the multi-tone calibration signal $S_{CAL}$ includes a repetitive bit sequence, such as a PRBS, for example. However, other types of multi-tone calibration signals may be incorporated, without departing from the scope of the present teachings.

In the depicted embodiment, the multi-tone calibration signal generation circuit 220 includes adder 222 and mixer 224. The adder 222 adds a repetitive bit sequence (e.g., PRBS) and DC offset (optional), and the mixer 224 mixes the DC offset repetitive bit sequence with a carrier having a frequency that approximately matches the upper frequency (or upper bandwidth) B of the first sub-signal $SS_1$ (e.g., about 32 GHz), in the present example. That is, where N=2, the carrier frequency B applied to the mixer 224 is about one half (1/N) an upper frequency 2*B Hz of the frequency band of the input signal $S_{IN}$. Accordingly, the coupled input signal $S_{IN}$ output by the coupler 210 includes the repetitive bit sequence of the multi-tone calibration signal $S_{CAL}$ at about the frequency where the coupled input signal $S_{IN}$ is to be divided. As a result, the multi-tone calibration signal $S_{CAL}$ includes tones in a transition frequency band around B (e.g., about 32 GHz), which includes frequencies that overlap both the first and second sub-signals $SS_1$ and $SS_2$. That is, the multi-tone calibration signal $S_{CAL}$ is a low-level signal that includes multiple frequency components spanning frequencies around B in the transition frequency band.

Generally, a repetitive bit sequence has frequency characteristics that are periodic in nature, and thus the spectrum of the repetitive bit sequence has a set of tones, the spacing and relative amplitudes of which are functions of the specific bit sequence. In an embodiment, the spectrum of the repetitive bit sequence of the multi-tone calibration signal $S_{CAL}$ injected into the input signal $S_{IN}$ may extend from DC to a nominal value. Given that the repetitive bit sequence is represented by a zero-order hold (NRZ) waveform, the spectrum may be given by the frequency transform of the repetitive bit sequence multiplied by a sin(x)/x waveform. For example, an FFT may be used to generate a frequency transform of a time domain sequence, although various alternative methods may be incorporated herein. In the limit of a long PRBS, for example, the spectrum of the repetitive bit sequence becomes quasi-continuous, while a shorter PRBS results in the spectrum being composed of fewer tones leading to a more discrete spectrum.

Generally, signals that are periodic in time are discrete in frequency and vice versa. That is, if a signal has a repetitive component in the time domain, it will have a tone in the frequency domain. The NRZ point is separate—a zero-order hold or NRZ waveform can be viewed as the time-domain convolution of a time sequence of delta functions and a unit step u(t), given by u(t)=s(t)−s(t−T), where s(t) is a step which is zero for t<0 and unity for t>0, and T=1. Convolution in the time domain is multiplication in the frequency domain, so an NRZ waveform in the frequency domain is the product of the frequency domain representation of the time domain impulse (delta function) sequence and the frequency domain representation of u(t). The transform of u(t) is a sinc function with the first null at (1/T).

Use of an appropriate repetitive bit sequence in the multi-tone calibration signal $S_{CAL}$ affords several advantages over a single sinusoid signal, for example. First, the multi-tone calibration signal $S_{CAL}$ includes a number of tones (e.g., about 3 tones to about 11 tones, for example), so the probability of the input signal $S_{IN}$ exactly masking the set of tones is made arbitrarily small. Second, because the magnitude and phase of each component tone in the multi-tone calibration signal $S_{CAL}$ is known, the resultant calibration from the use of the multi-tone calibration signal $S_{CAL}$ provides information regarding multiple frequency points. For example, when the repetitive bit sequence is designed to provide tones that span frequencies near B in the transition frequency band of frequencies present in both the first and second sub-signals $SS_1$ and $SS_2$, the gain and phase characteristics of the first and second sub-signals $SS_1$ and $SS_2$ within the transition frequency band may be accurately mapped using the single multi-tone calibration signal $S_{CAL}$.

Notably, even though the multi-tone calibration signal $S_{CAL}$ includes a number of tones, it is still completely deterministic and hence may be removed from a digitized signal by digitally recreating the repetitive bit sequence and subtracting the repetitive bit sequence from the digitized signal, as discussed below. Also, because the repetitive bit-sequence is known and deterministic, it is possible to lock onto the multi-tone calibration signal $S_{CAL}$ under poor signal-to-noise conditions using various known techniques. This makes it possible to minimize the impact to the dynamic range of the channel by including the multi-tone calibration signal $S_{CAL}$. An example of such a technique is to cross-correlate the input signal $S_{IN}$ with the known bit-sequence, which allows one to minimize the amplitude of $S_{CAL}$, so as to minimize the impact.

The splitter 215 receives the coupled input signal $S_{IN}$ from the coupler 210, and divides the input signal $S_{IN}$ into the first and second sub-signals $SS_1$ and $SS_2$. In an embodiment, the splitter 215 may be a diplexer, for example, although other types of signal splitters may be incorporated without departing from the scope of the present teachings. Each of the first and second sub-signals $SS_1$ and $SS_2$ has a bandwidth of approximately B (e.g., about 32 GHz), where a first frequency band of the first sub-signal $SS_1$ is from DC to approximately B (e.g., about 32 GHz) and a second frequency band of the second sub-signal $SS_2$ is from approximately B to approximately 2*B (e.g., about 32 GHz to about 64 GHz). As discussed above, the first and second frequency bands overlap in the predetermined transition frequency band. For example, the first frequency band may actually end at B+0.5 GHz and the second frequency band may actually begin at B−0.5 GHz, resulting in a 1 GHz overlap bandwidth or transition frequency band (e.g., extending from about 31.5 GHz to about 32.5 GHz). The tones from the previously injected multi-tone calibration signal $S_{CAL}$ are included in the transition frequency band.

In the depicted embodiment, the first sub-signal $SS_1$ passes through the first sub-signal path 230, and the second sub-signal $SS_2$ passes through the second sub-signal path 240 passes. However, it is understood that in alternative embodiments, the calibration system 200 may be configured to divide the input signal $S_{IN}$ into three or more sub-signals, e.g., by providing additional sub-signal paths corresponding to the additional sub-signals, without departing from the scope of the present teachings.

The first sub-signal path 230 includes first analog-to-digital converter (ADC) 236 for digitizing the first sub-signal $SS_1$. The first sub-signal path 230 may further include various signal processing devices, such as illustrative first sub-signal filter 232, which may be an AA filter, for example, having a passband of DC to about B. Notably, because the first sub-signal $SS_1$ has frequencies below B, it can be directly processed by an oscilloscope, for example, that has B bandwidth channels, and thus no further processing is required on the first sub-signal $SS_1$ at this point.

In comparison, although the second sub-signal $SS_2$ likewise has a bandwidth of about B, it has frequencies spanning from about B to about 2*B, and thus can not be directly processed by such an oscilloscope. The second sub-signal path 240 is therefore configured to perform a pre-processing, frequency translation on the second sub-signal $SS_2$ in order to provide the second sub-signal $SS_2$ in a frequency band that substantially corresponds to the frequency band of the first sub-signal $SS_1$, e.g., DC to about B, as discussed above. Accordingly, the second sub-signal path 240 includes mixer 243, second ADC 246, and various signal processing devices to enhance operations, such as illustrative second sub-signal filter 242 (following first pre-amp 241) and frequency translated second sub-signal filter 245 (following second pre-amp 244). The second sub-signal filter 242 may be an AA filter having a passband of about B to about 2*B and the frequency translated second sub-signal filter 245 may be an AA filter having a passband of about DC to about B, for example. The second sub-signal filter 242 may be an image rejection filter, which prevents the mixer 243 from down-converting signals that extend from 2*B to 3*B in this example to baseband.

The mixer 243 is configured to multiply the second sub-signal $SS_2$ by a local oscillator (LO) signal having and LO frequency selected to translate frequency components of the second sub-signal $SS_2$ to reduce the maximum frequency component of the second sub-signal $SS_2$ to below a given threshold. In the depicted example, the mixer 243 performs high-side mixing, where the LO frequency is about double the upper frequency of the bandwidth of the first sub-signal $SS_1$, or about 2*B Hz (e.g. about 64 GHz). The LO frequency may be obtained, for example, by doubling the carrier frequency B used to mix the multi-tone calibration signal $S_{CAL}$ via frequency doubler 226, although other techniques may be applied. In alternative configurations, the mixer 243 may perform low-side mixing, where the second sub-signal $SS_2$ is multiplied by an LO frequency that is substantially the same as the highest frequency in the frequency band of the first sub-signal $SS_1$, or about B Hz (e.g., about 32 GHz). After the mixing, the mixer 243 outputs a frequency translated second sub-signal $SS_2$ which has a frequency band that substantially corresponds to the frequency band of the first sub-signal $SS_1$ (e.g., about DC to about 32 GHz). The frequency translated second sub-signal $SS_2$ is amplified by the second pre-amp 244, bandpass filtered by the frequency translated second sub-signal filter 245 and digitized by the second ADC 246.

The digitized first sub-signal $SS_1$ output from the first sub-signal path 230 and the digitized frequency translated second sub-signal $SS_2$ output from the second sub-signal path 240 are input to processing device 250 via first and second channels, respectively. For example, the processing device 250 may be included in an oscilloscope and the first and second channels may be B bandwidth channels, as discussed above. The processing device 250 is configured to perform a second frequency translation (in the digital domain) on the frequency translated second sub-signal $SS_2$ in order to reconstruct the second sub-signal $SS_2$, to quantify and correct impairments in the digitized first sub-signal $SS_1$ and the reconstructed second sub-signal $SS_2$, and ultimately to combine the digitized first sub-signal $SS_1$ and reconstructed second sub-signal $SS_2$ to reconstruct the input signal $S_{IN}$.

In various embodiments, the processing device 250 may be implemented in whole or in part by any of various processing devices, such as a processor, a central processing unit (CPU), application specific integrated circuits (ASICs), field-programmable gate arrays (FPGAs), Cloud resource, or combinations thereof, using software, firmware, hard-wired logic circuits, or combinations thereof. The processing device 250 may be located in an oscilloscope or other signal processing and analysis device, or may be externally provided. When using a processor or CPU, a memory (not shown) is included with the processing device 250 for storing executable software/firmware and/or executable code that controls the calibration of forming a reconstructed signal from multiple sub-signals. The memory may include any number, type and combination of nonvolatile read only memory (ROM) and volatile random access memory (RAM), such as a disk drive, an electrically programmable read-only memory (EPROM), an electrically erasable and programmable read only memory (EEPROM), a CD, a DVD, a universal serial bus (USB) drive, Cloud resource, and the like.

Subsequent to the analog-to-digital conversion operations performed by the first and second ADCs 236 and 246, respectively, digital representations of the first sub-signal $SS_1$ and the frequency translated second sub-signal $SS_2$ are available for display or further processing. However, to form an accurate representation of the original input signal $S_{IN}$, the data is first reconstructed by the processing device 250, as mentioned above. Generally, reconstructing the input signal $S_{IN}$ may be done in the digital domain by applying the inverse of the frequency translation step previously performed with respect to the second sub-signal $SS_2$, and then combining first sub-signal $SS_1$ and frequency translated, reconstructed second sub-signal $SS_2$.

A digital frequency converter may be used to apply the inverse of the frequency translation. According to a representative embodiment, the digital frequency converter may be an up-sampler, and applying the inverse of the frequency translation step includes performing rational up-sampling of the second sub-signal $SS_2$, where impairments may be identified and corrected before the up-sampling. Rational up-sampling includes interpolation to change a sample rate of the data of the second sub-signal $SS_2$ from that at which the data was recorded to a new sample rate that is twice the original analog LO frequency used in the first frequency translation. A low pass filter may be used for interpolating the low-band and a high-pass filter may be used for interpolating the intermediate frequency (IF)-band. The interpolation of the IF is a record of the high-band that has been returned to its original frequency band. If the up-sampling factor is the ratio of two integers, for example 8:5, then the computation of the up-sampled record is known to be efficient using poly-phase filtering.

In an alternative embodiment, the digital frequency converter may be a digital mixer, and applying the inverse of the frequency translation step may include digitally synthesizing a replica of the LO signal used for frequency translating the second sub-signal $SS_2$ by the mixer 243. The synthesized replica of the LO signal is digitally multiplied with the digitized frequency translated second sub-signal $SS_2$, which effectively reverses the first frequency translation.

Once the second sub-signal $SS_2$ has been restored to its original frequency band between approximately B and approximately 2*B, impairments are identified and corrected (as discussed below) and the digitized first and second sub-signals $SS_1$ and $SS_2$ are combined to recreate the original input signal $S_{IN}$. As mentioned above, the phase of the replicated LO signal is the same as the phase of the LO frequency used in the first frequency translation, e.g., to remove the ambiguity of the phase of the LO signal used in each of the frequency translation steps.

Thus, two channels having limited B bandwidths have been effectively combined through the technique described above to synthesize a single channel having a bandwidth of 2*B. As discussed above, the technique may be expanded to encompass more than two sub-signals, the result being that N channels each with bandwidth B can be combined to synthesize a single channel with bandwidth N*B.

The process of combining sub-signals to reconstruct the original input signal is subject to degradation or impairments from several non-idealities. Of particular interest is preservation of phase and magnitude of the input signal $S_{IN}$. Therefore, prior to reconstructing the input signal $S_{IN}$, the impairments in the digitized first sub-signal $SS_1$ and reconstructed second sub-signal $SS_2$ are quantified and corrected, according to various embodiments.

Generally, there are several sources of error which can degrade phase and magnitude accuracy. The first source of error results from the process of dividing the input signal $S_{IN}$ into the constituent sub-signals, such as first and second sub-signals $SS_1$ and $SS_2$. For example, the input signal $S_{IN}$ having frequency components from DC to about 2*B is split into the first sub-signal $SS_1$ containing frequency components from DC to about B and the second sub-signal $SS_2$ containing frequencies from about B to about 2*B. As mentioned above with respect to the splitter 215, the splitting process may be performed by a filter structure known as a diplexer. An ideal diplexer would split the input signal $S_{IN}$, shunting all frequencies between DC and B to the first sub-signal $SS_1$ and all frequencies between B and 2\*B to the second sub-signal $SS_2$ with no disturbance of the phase or magnitude of the input signal $S_{IN}$ as it is split. A physically realizable diplexer, however, requires a non-zero overlap of the first and second sub-signals $SS_1$ and $SS_2$, and typically introduces a phase distortion, especially in the overlap region (transition frequency band). For example, as discussed above, a physically realizable diplexer may allow frequency components from DC to about 1.1*B to appear as the first sub-signal $SS_1$ and frequency components from about 0.9*B to about 2*B to appear as the second sub-signal $SS_2$. Of course, conservation of power would require that the magnitudes of the first and the second sub-signals $SS_1$ and $SS_2$ within the transition frequency band, e.g., between 0.9*B and 1.1*B in the present example, be partitioned between the first and the second sub-signals $SS_1$ and $SS_2$. In addition, the phase response of the diplexer, especially in the transition frequency band, is likely to be non-ideal. That is, the diplexer will impose a different group delay for the different frequency components based on frequency. These variations must be measured and corrected for accurate reconstruction of the input signal $S_{IN}$.

The second source of error is the phase of the LO signal used in the frequency translation process of the second sub-signal $SS_2$ by the mixer 243, or more particularly, the relative phase between the LO signal used in the first frequency translation process and the digitally synthesized (replica) LO signal used in the second frequency translation to reverse the action of the first frequency translation, reconstructing the second sub-signal $SS_2$. This relative phase difference appears as a phase shift of the reconstructed second sub-signal $SS_2$. Because only the second sub-signal $SS_2$ is subjected to frequency translation, a phase shift applied to the second sub-signal $SS_2$ is not applied to the first sub-signal $SS_1$. Since frequency components near B appear in both the first and second sub-signals $SS_1$ and $SS_2$, a phase shift applied only to the second sub-signal $SS_2$ will cause distortion to the reconstructed input signal $S_{IN}$ when the first and second sub-signals $SS'$ and $SS_2$ are combined.

The third source of error is mismatch in the phase and magnitude responses of the channels. The effect is similar to that of the first impairment, described above, in that a mismatch in the magnitude and phase response of the first and second channels will alter signal frequency components near B which appear in both the first and second sub-signals $SS_1$ and $SS_2$ in a dissimilar manner. This results in distortion upon reconstruction of the input signal $S_{IN}$ if left uncorrected. Generally, the largest source of this error results from the presence of the amplifiers (e.g., first pre-amp 241 and second pre-amp 244) and filters (e.g., second sub-signal filter 242 and frequency translated second sub-signal filter 245) in second sub-signal path 240, since filters and amplifiers typically have non-ideal frequency responses.

The impairments from the three sources of error (as well as other potential sources of error) may be viewed effectively as a difference in the magnitude (or gain) and phase transfer functions of frequency components near B, which appear in both the first and second sub-signals $SS_1$ and $SS_2$ (the transition frequency band). That is, the root causes of the various impairments are unimportant to the operation of the embodiments. The impairments must be quantified and corrected to accurately reconstruct the original input signal $S_{IN}$ from the first sub-signal $SS_1$ and the reconstructed second sub-signal $SS_2$.

As discussed above, the low-level multi-tone calibration signal $S_{CAL}$ is continuously injected into the filtered input signal $S_{IN}$ at the coupler 210 prior to the input signal $S_{IN}$ being divided into the first and second sub-signals $SS_1$ and $SS_2$. The multi-tone calibration signal $S_{CAL}$ includes frequency components spanning frequencies near B (i.e., within the transition frequency band) and a repetitive bit sequence, which has frequency characteristics that are periodic in nature. Thus, the spectrum of the repetitive bit sequence provides the set of tones, the spacing and relative amplitudes of which are a function of the specific repetitive bit sequence.

The tones of the repetitive bit sequence are present in the first sub-signal $SS_1$ and the reconstructed second sub-signal $SS_2$. Therefore, the impairments to first sub-signal $SS_1$ and the reconstructed second sub-signal $SS_2$ may be quantified within the transition frequency band using tones of the repetitive bit sequence. For example, as discussed above with reference to FIG. 3, tones of the multi-tone calibration signal $S_{CAL}$ may be frequency transformed, detected and analyzed, and the use of each of the tones is gated through comparison of received amplitude of the detected tone against the expected amplitude for that tone. The detected tones having amplitude outside a predetermined window of acceptable tolerance are removed from the algorithm, under the assumption that they have been corrupted by the input signal $S_{IN}$ being measured, leaving a revised set of tones. The revised set of tones provide relative gain and phase information for the first and second channels, all or part of which may be used for quantifying impairments in the first sub-signal $SS_1$ and the reconstructed second sub-signal $SS_2$. As mentioned above, various methods may then be used to correct the quantified impairments.

As discussed above, a computer processor, e.g., located in an oscilloscope and/or the processing device 250, may be used to control various aspects of the disclosed embodiment, including performing second frequency translations on sub-signal(s) other than a first (lowest frequency band) sub-signal to reconstruct the sub-signal(s), quantifying impairments to the first sub-signal and the reconstructed sub-signal(s), correcting the quantified impairments, and reconstructing the input signal using the impairment corrected first sub-signal and reconstructed sub-signal(s). When using a processor, a memory or other computer readable medium, including any number, type and combination of nonvolatile ROM and volatile RAM, may be provided for storing executable software/firmware and/or executable code that allows it to perform the various functions.

While specific embodiments are disclosed herein, many variations are possible, which remain within the concept and scope of the invention. Such variations would become clear after inspection of the specification, drawings and claims herein. The invention therefore is not to be restricted except within the scope of the appended claims.

What is claimed is:

1. A method of calibrating a reconstructed signal from a plurality of sub-signals, the method comprising:
    injecting a calibration signal into a received input signal, the calibration signal comprising a plurality of tones;
    dividing the input signal with the injected calibration signal into at least a first sub-signal having a first frequency band and a second sub-signal having a second frequency band, wherein a portion of the first frequency band overlaps a portion of the second frequency band to form an overlapping frequency band;
    performing a first frequency translation by converting frequency components of the second sub-signal within the second frequency band to obtain a frequency converted second sub-signal;
    digitizing the first sub-signal and the frequency converted second sub-signal;
    quantifying impairments to the first sub-signal and the second sub-signal caused by differences in magnitude and phase of frequency components of the first and second sub-signals within the overlapping frequency band; and
    performing a second frequency translation to reverse the first frequency translation by converting the frequency components of the digital frequency converted second sub-signal to the frequency components within the second frequency band to obtain a reconstructed second sub-signal,
    wherein quantifying the impairments comprises measuring relative magnitudes and phases of the plurality of tones of the calibration signal present in the digital first sub-signal and one of the frequency converted second sub-signal and the reconstructed second sub-signal.

2. The method of claim 1, further comprising:
    correcting the quantified impairments; and
    reconstructing the input signal by combining the corrected first sub-signal and the corrected reconstructed second sub-signal.

3. The method of claim 1, wherein the plurality of tones of the calibration signal are in the overlapping frequency band.

4. The method of claim 1, wherein measuring the relative magnitudes and phases of the plurality of tones of the calibration signal comprises:
    applying a fast Fourier transform (FFT) to the plurality of tones; and
    determining the relative magnitudes and phases of the plurality of tones of the calibration using the FFT.

5. The method of claim 2, wherein correcting the quantified impairments comprises:
    constructing a filter having frequency response that inverts distortion imposed by dividing and reconstructing the input signal to correct at least the magnitudes of the plurality of tones.

6. The method of claim 5, wherein correcting the quantified impairments further comprises:
    matching the phases between the plurality of tones in the first sub-signal and the second sub-signal to globally correct the phases of the plurality of tones.

7. The method of claim 1, wherein the calibration signal is continuously injected into the input signal.

8. The method of claim 3, wherein the calibration signal comprises a repetitive bit sequence modulating a carrier at a first frequency corresponding to an upper bandwidth of the first frequency band.

9. The method of claim 8, wherein the repetitive bit sequence comprises a pseudo-random bit sequence (PRBS).

10. The method of claim 8, wherein a spectrum of the repetitive bit sequence extends from DC to a nominal value, and the repetitive bit sequence is represented by a zero-order hold (NRZ) waveform.

11. The method of claim 4, wherein quantifying the impairments further comprises gating use of the plurality of tones of the calibration signal based on analysis of each tone of the plurality of tones.

12. The method of claim 11, wherein gating the use of the plurality of tones of the calibration signal comprises:
    comparing an amplitude of each tone to a predetermined tolerance window; and
    removing a tone from use when the amplitude of the tone is outside the predetermined tolerance window.

13. The method of claim 1, wherein converting the frequency components of the second sub-signal within the second frequency band comprises:
    multiplying the second sub-signal by a mixing signal having a predetermined frequency substantially the same as a highest frequency in the second frequency band.

14. The method of claim 1, wherein converting the frequency components of the second sub-signal within the second frequency band comprises:
    multiplying the second sub-signal by a mixing signal having a predetermined frequency substantially the same as a highest frequency in the first frequency band.

15. The method of claim 1, wherein converting the frequency components of the digital frequency converted second sub-signal to the frequency components within the second frequency band comprises:
    performing rational up-sampling of the digital frequency converted second sub-signal, wherein impairments are quantified before performing the rational up-sampling.

16. The method of claim 1, wherein converting the frequency components of the digital frequency converted second sub-signal to the frequency components within the second frequency band comprises:
    synthesizing a replica of a local oscillator used to obtain the predetermined frequency; and digitally multiplying the reconstructed second sub-signal by the synthesized replica of the local oscillator.

17. The method of claim 1, further comprising:
providing the first sub-signal to a first oscilloscope channel and the frequency converted second sub-signal to a second oscilloscope channel before digitizing the first sub-signal and the frequency converted second sub-signal,
wherein each oscilloscope channel has a channel bandwidth approximately equal to the first frequency band.

18. The method of claim 1, wherein performing the first frequency translation comprises converting the frequency components of the second sub-signal within the second frequency band to corresponding frequency components within the first frequency band.

19. A method of calibrating a reconstructed signal from a plurality of sub-signals, the method comprising:
injecting a calibration signal into a received input signal, the calibration signal comprising a plurality of tones;
dividing the input signal with the injected calibration signal into a plurality of sub-signals having a corresponding plurality of frequency bands, including a first sub-signal having a lowest frequency band, wherein portions of adjacent frequency bands overlap to form a corresponding overlapping frequency band;
performing first frequency translations by converting frequency components of each sub-signal other than the first sub-signal band to obtain a frequency converted sub-signal;
digitizing the first sub-signal and each of the frequency converted sub-signals;
quantifying impairments to the plurality of sub-signals caused by differences in magnitude and phase of the corresponding frequency components within each overlapping frequency band; and
performing second frequency translations to reverse the first frequency translations to obtain reconstructed sub-signals corresponding to the frequency converted sub-signals,
wherein quantifying the impairments comprises measuring relative magnitudes and phases of the plurality of tones of the calibration signal present in the plurality of sub-signals.

20. A system for calibrating a reconstructed signal from a plurality of sub-signals, the system comprising:
a coupler configured to inject a calibration signal into an input signal, the calibration signal comprising a plurality of tones in a predetermined frequency range;
a splitter configured to split the input signal with the injected calibration signal into a first sub-signal having a first frequency band and a second sub-signal having a second frequency band, wherein a portion of the first frequency band overlaps a portion of the second frequency band to form a transition frequency band, which corresponds to the predetermined frequency range;
a mixer configured to multiply the second sub-signal and a local oscillator frequency to convert frequency components of the second sub-signal within the second frequency band to a lower frequency band;
a first analog-to-digital converter (ADC) configured to digitize the first sub-signal;
a second ADC configured to digitize the frequency converted second sub-signal;
a digital frequency converter configured to multiply the digital frequency converted second sub-signal and a synthesized local oscillator replicating the local oscillator frequency used to obtain the frequency converted second sub-signal to convert the frequency components of the digital frequency converted second sub-signal to the frequency components within the second frequency band to obtain a reconstructed second sub-signal; and
a processor configured to quantify impairments to the digital first sub-signal and the reconstructed second sub-signal caused by differences in magnitude and phase of frequency components of the first and second sub-signals within the transition frequency band, wherein quantifying the impairments comprises measuring relative magnitudes and phases of the plurality of tones of the calibration signal present in the digital first sub-signal and the reconstructed second sub-signal.

21. The system of claim 20, wherein the digital frequency converter comprises a digital mixer.

22. The system of claim 20, wherein the digital frequency converter comprises an up-sampler.

23. The system of claim 20, wherein the processor is further configured to correct the quantified impairments, and to reconstruct the input signal by combining the corrected digital first sub-signal and the corrected reconstructed second sub-signal.

* * * * *